US005151584A

United States Patent [19]
Ebbing et al.

[11] Patent Number: 5,151,584
[45] Date of Patent: Sep. 29, 1992

[54] METHOD AND APPARATUS FOR ENDPOINT DETECTION IN A SEMICONDUCTOR WAFER ETCHING SYSTEM

[75] Inventors: Peter Ebbing, Los Altos; Manoocher Birang, Santa Clara, both of Calif.

[73] Assignee: Applied Materials, Inc., Santa Clara, Calif.

[21] Appl. No.: 777,770

[22] Filed: Oct. 15, 1991

Related U.S. Application Data

[60] Division of Ser. No. 652,297, Feb. 5, 1991, Pat. No. 5,007,464, which is a continuation of Ser. No. 446,025, Dec. 5, 1989, abandoned, which is a division of Ser. No. 221,979, Jul. 20, 1988, Pat. No. 4,953,982.

[51] Int. Cl.$^5$ .............................................. G01J 1/20
[52] U.S. Cl. ................................................. 250/201.4
[58] Field of Search .................. 250/566, 201.4, 201.5, 250/201.7, 561, 560; 354/403

[56] References Cited

U.S. PATENT DOCUMENTS

| 4,569,717 | 2/1986 | Ohgami et al. | 156/626 |
| 4,618,262 | 10/1986 | Maydan et al. | 356/357 |
| 4,818,886 | 4/1989 | Drucker | 250/566 |

FOREIGN PATENT DOCUMENTS 8704237 7/1987 PCT Int'l Appl.

OTHER PUBLICATIONS

IBM Tech. Disclosure Bulletin, Oct. 1985, vol. 28, No. 5, pp. 2147-2148.

*Primary Examiner*—David C. Nelms
*Attorney, Agent, or Firm*—Paul L. Hickman

[57] ABSTRACT

A method for endpoint detection in a semiconductor wafer etching system characterized by the steps of: 1) scanning a semiconductor wafer with a narrowly focused laser beam; 2) analyzing a reflected portion of the beam to determine a preferred parking spot on a preferred flat area of the wafer; 3) parking the beam at the preferred spot; and 4) analyzing the reflected portion of the beam to determine when the preferred flat area has been etched through. The beam spot of the laser beam is smaller than the width of the preferred flat area to eliminate noise generated at the transition boundaries of the flat area. Preferably, the wafer is scanned several times along the same beam path to permit the comparison of several scans to determine the preferred parking spot. The apparatus includes a beam forming assembly; a scanning assembly which causes the laser beam to scan across the wafer; a detection assembly responsive to a portion of the laser beam which is reflected off of the wafer; and a controller which operates the laser and the scanning assembly and which is responsive to an output of the detection assembly. When output of the detection assembly indicates a cessation of the characteristic etching curve, the controller develops an endpoint detection signal which can automatically shut down the etching system.

1 Claim, 7 Drawing Sheets

METHOD AND APPARATUS FOR ENDPOINT DETECTION IN A SEMICONDUCTOR WAFER ETCHING SYSTEM

"This is a divisional of copending application(s) Ser. No. 07/652,297 filed on Feb. 5, 1991", now U.S. Pat. No. 5,077,464 which is a continuation of Ser. No. 446,025 filed Dec. 5, 1989 now abandoned, which is a division of Ser. No. 221,979 filed Jul. 20, 1988, now U.S. Pat. No. 4,953,982.

BACKGROUND OF THE INVENTION

This invention relates generally to front-end integrated circuit processing methods and equipment, and more particularly to laser interferometer end point detection systems.

Integrated circuits are fabricated in bulk on semiconductor wafers. Typically, scribe lines are provided on the surface of a wafer in a grid pattern, such that the individual integrated circuits or "chips" can be easily separated from each other. After the wafer is fully processed it can be broken or cut along the scribe lines to separate the chips for packaging.

The semiconductor wafer is repetitively subjected to a number of processes during the integrated circuit fabrication procedure such as masking, etching, layer formation, and doping. The present invention is primarily concerned with the etching process, i.e. the removal of layers of materials from the surface of semiconductor wafers.

As the density and complexity of integrated circuits increase the sizes of the various features within the integrated circuits necessary decrease. This evolution towards small feature sizes requires a high level of control over the etching process. For example, the etching process should be highly anisotropic so as to provide an edge profile with a high aspect ratio. Also, the etching process should be very controllable so that the etching process can be predictably stopped after the layer has been etched through.

Determining when a layer has been etched through can be an open-loop process, i.e. the etching process can be allowed to progress for a predetermined period of time with the hope that the layer will be etched through without too much over-etching. However, since wafers do not always etch at the same rate, there is a tendency to run the etching process long enough to etch through the slowest etching wafers, resulting in over-etching of the faster etching wafers. As feature sizes become smaller, this results in an unacceptably high defect rate and, thus, this open-loop method is not used on state of the art etching equipment.

Most modern etching equipment make some provisions for endpoint detection, i.e. detection of etch-through in a desired layer. One approach which is useful with semi-transparent layers such as silicon dioxide ($SiO_2$) is to use the principles of laser interferometry. With laser beam interferometry, a laser beam is directed at the layer being etched and a reflected portion of the beam is detected by an appropriate photodetector. Since the etching layer is semi-transparent to the frequency of laser light being used, some of the incident beam will be reflected from the top surface of the layer and some of the beam will be reflected from the bottom surface of layer. These two reflections will either constructively or destructively interfere with each other, creating a characteristic sinusoidal etching curve as the layer is etched away. When the etching curve flattens out, the layer has been etched through and endpoint has been detected.

One such laser interferometer system is described in U.S. Pat. No. 4,618,262 of Maydan et al. which is assigned in common with the present invention to Applied Materials, Inc. of Santa Clara, California. In the Mayden et al. patent, a process is described which includes scanning a laser beam across scribe lines on a wafer being etched, and monitoring the resultant interference pattern. Alternatively, Maydan et al. teach a process including the scanning of a laser beam across a wafer to find a scribe line, locking the laser beam on to the scribe line, and then monitoring the resulting interference pattern. In both processes, the size of the laser beam spot is comparable to the width of the scribe lines. In other laser interferometer end point detection systems, the laser spot is much larger than the width of the scribe lines.

While laser interferometer systems such as the one taught by Maydan et al. perform admirably, they have been found to be sensitive to various forms of noise. For example, it has been found that a great deal of noise is generated at the detector when the laser beam scans over a step or transition on the wafer, and that noise is at a minimum on surfaces having uniform film thicknesses. Such transitions are commonly produced by photomasking processes where a patterned layer of photoresist is developed on top of a layer to be etched. In consequence, when the laser beam spot is comparable to or larger than the width of the scribe lines it is inevitable that a certain amount of noise will be generated as the beam traverses the scribe lines, since a portion of the beam will always be on a transition.

The noise amplitude obtained while traversing a transition can be significantly higher than the amplitude of the etching curves of the flat surfaces. In the past, the laser beam might lock onto such a transition due to this high noise level, resulting in the monitoring of the photoresist or a combination of photoresist and silicon dioxide. The usefulness of a smaller beam size with an adequate depth of field to alleviate this problem was heretofore unrecognized.

Other factors which can generate noise in a laser interferometer system include air currents, heat shimmer, and machine vibrations. While these factors can never be eliminated entirely, efforts should be made to minimize each of these factors in a precision laser interferometer endpoint detection system.

It is also important that laser interferometer endpoint detection systems recognize the flattening of the characteristic etching curve quickly and accurately. In Mayden et al. a computer is used to recognize the flattening of the characteristic etching curve by monitoring its slope. However, it always desirable to develop improved methods which recognize the endpoint condition more quickly and more repeatably run after run.

SUMMARY OF THE INVENTION

This invention automatically and reliably detects the endpoint of a semiconductor wafer etching operation. The method of the invention includes the repetitive scanning of a wafer with a laser beam along a single scan path and the detection of a portion of the laser beam which is reflected off of the wafer. The reflected beam is analyzed to determine a preferred parking spot within a preferred flat area of the wafer. Once the preferred parking spot has been determined, the beam is moved to the spot and the detector is used to monitor the characteristic etching curve of the thin film. Once the etching curve flattens off, the preferred flat area is considered to be etched through, and an endpoint signal is generated.

The invention includes three major processes, a first of which involves the selection of the preferred parking spot. In this first process, pairs of scans are compared to develop a quality factors Q corresponding to the central location of the widest flat area and highest etch rate found in any two scans. After comparing a number of scan pairs, the maximum value $Q_{max}$ is used to select the preferred parking spot. In a second process, the actual etching curve is compared to a projected etching curve after each maxima is detected. When the actual etching curve and the projected etching curve deviate substantially, endpoint is declared by the system. In a third process, a laser beam is focussed by using a novel test wafer and focussing method. The focussing method includes scanning the laser beam across a test pattern having lines of varying widths; detecting the variance in the reflected portion of the beam; and adjusting the focus of the beam to minimize the variance.

The apparatus of the present invention includes a beam forming assembly, a scanning assembly, a detection assembly, an environmental isolation assembly, and a controller. The environmental isolation assembly isolates the beam forming assembly from the reaction chamber of the etcher, thereby reducing aberrations due to air currents, heat shimmer, etc. The beam forming assembly includes an optical isolation assembly to prevent reflection of the laser beam back into the laser, a beam expanding assembly, and a beam focussing assembly for focussing the expanded beam onto the semiconductor wafer. The controller is responsive to an output of the detection assembly, and is operative to carry out the aforementioned processes of the present invention.

Due to the improved optics of the apparatus and the focussing method of this invention, the spot size of the laser beam has been reduced considerably over the previous state of the art. In the past, the smallest laser spot size having adequate depth of field was approximately 100 micrometers, while the spot size of this invention can be less than 40 mircometers. This small spot size permits a preferred parking spot to be chosen within a preferred flat area having a width of 70 micrometers or more. Since the laser beam spot is completely within the preferred flat area, noise associated with reflection from the transition boundaries of the flat area have been eliminated.

The method of this invention for detecting endpoint is quick, accurate, and repeatable. Typically, endpoint can be detected within a small fraction of the etching cycle, permitting the etching system to be quickly shut down or to be run for a predetermined time after endpoint detection.

These and other advantages of the present invention will become apparent to those skilled in the art after reading the following descriptions and studying the various figures of the drawing.

BRIEF DESCRIPTION OF THE DRAWINGS

FIG. 3a is a graph of reflected interference pattern waveforms from two different spots on the semiconductor wafer of FIG. 2a.

FIG. 8 is a top plan view of the endpoint detection apparatus illustrated in FIG. 7a.

DETAILED DESCRIPTION OF THE PREFERRED EMBODIMENTS

The Basic Method

Figure 1:
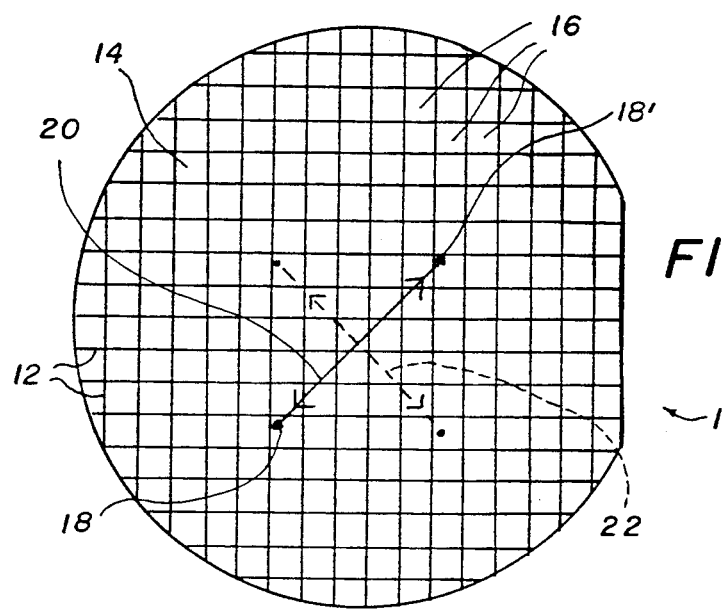
FIG. 1 is a top plan view of a scribed semiconductor wafer illustrating a typical laser beam scanning path employed by the method of the present invention.

With reference to the top plan view of FIG. 1, a semiconductor wafer 10 is provided with a number of scribe lines 12 which are laid out in a grid pattern on the top surface 14 of the wafer. Individual integrated circuits are typically batch processed on the wafer 10 within chip locations 16. After the wafer has been fully processed, the wafer is cut or broken along the scribe lines 12 to separate the individual integrated circuits for packaging.

The present invention scans a laser beam spot 18 along a path 20 to a location 18'. This scanning operation is accomplished automatically under computer control, and is highly repeatable such that multiple scans can be accomplished along a substantially identical scan path 20. Since the path 20 is preferably several centimeters long, it will be appreciated that the laser beam spot 18 will cross at least several scribe lines 12 and chip locations 16. If, for some reason, the path 20 does not cross a scribe line, the apparatus can be manually adjusted along an axis 22 such that the beam path 20 does cross a scribe line 12. The adjusted path would still, however, be parallel to the path 20 depicted in FIG. 1.

Figure 2A:
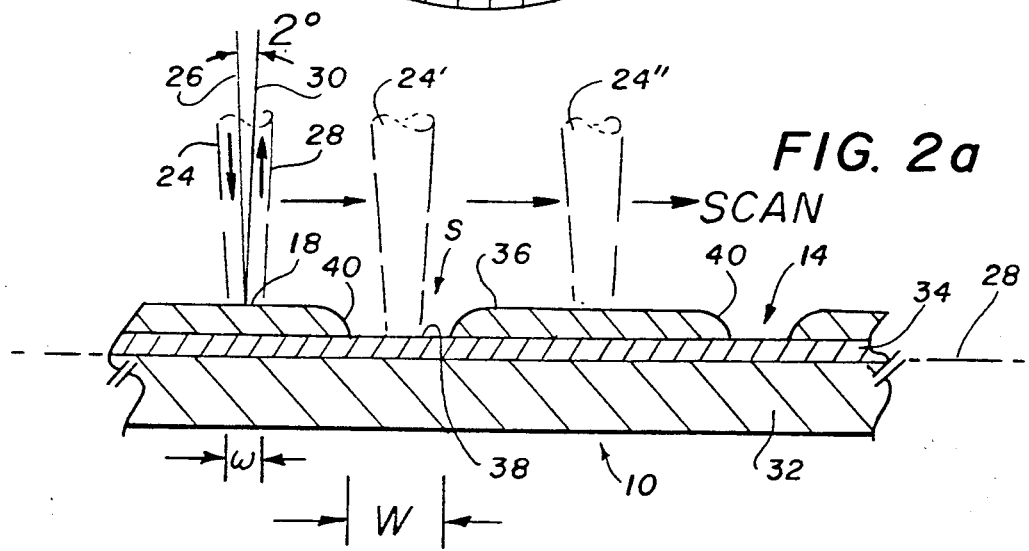
FIG. 2a is a cross-sectional view of a partially processed semiconductor wafer illustrating a laser beam located at various spots along the surface of the wafer.

With reference to FIG. 2a, laser beam spot 18 is produced by an incident laser beam 24 having an axis 26 which is slightly non-perpendicular to the plane 28 of the top surface 14 of the wafer 10. For example, axis 26 of the incident beam 24 can be approximately 91° from the plane 28. This will cause a reflected beam 28 to have an axis 30 which is approximately 89° from the plane 28. Thus, in this example, there is an approximtely 2° separation between the axes of incident beam 24 and reflected beam 28. This minimizes the possibility of reflected light adversely effecting the desired constant output of the laser beam source.

Figure 2B:
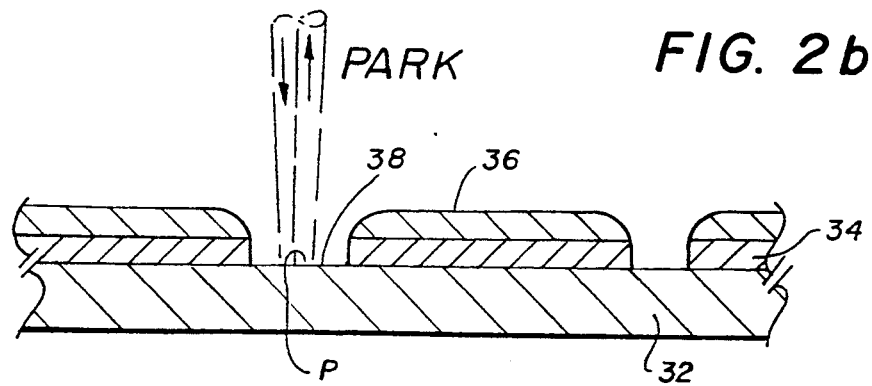
FIG. 2b is a cross-sectional view of a partially processed semiconductor wafer with a laser beam parked at a spot on the surface of the wafer.

The cross-sections of FIGS. 2a and 2b illustrate typical layers of a partially processed semiconductor wafer 10. These layers include the semiconductor substrate, a silicon dioxide (SiO$_2$) layer 34, and a photoresist layer 36. As seen in FIG. 2a, as the incident beam 24 is scanned across the top surface 14 of the wafer 10 it will alternately produce a beam spot on the photoresist layer 36, then the silicon dioxide layer 34, and then on the photoresist layer 36 again. This is indicated by the incident beam positions 24, 24', and 24". This portion of the process is referred to herein as the "scanning mode".

It should be noted that the width w of the beam spot 18 is considerably smaller than the width W of an opening, such as scribe line S, in the photoresist layer 36. In the present embodiment of this invention, the beam spot is approximately 35 micrometers, while the typical width of a scribe line S is on the order of 80 micrometers. As will be discussed in greater detail subsequently, since the beam spot 18 is scanned along surface 14 in steps in the order of approximately 5 micrometers, it is possible to obtain a number of data samples from a flat surface 38 within opening S. This is important in that a great deal of noise is generated when the beam spot falls on steps or transitions such as transitions 40 between the photoresist layer 36 and the silicon dioxide layer 34.

As noted previously, the beam spot 18 is preferably scanned along path 20 several times, eg. three or four times. A process, which will be discussed in detail subsequently, is then used to determine a preferred parking spot within a preferred flat area on the wafer 10. For example, and with reference to FIG. 2b, we will assume that the preferred parking spot P is determined to be within flat area 38. The beam spot is then moved to parking spot P and is left there for the remainder of the etching process. This mode of operation is known herein as the "parking mode".

Figure 3A:
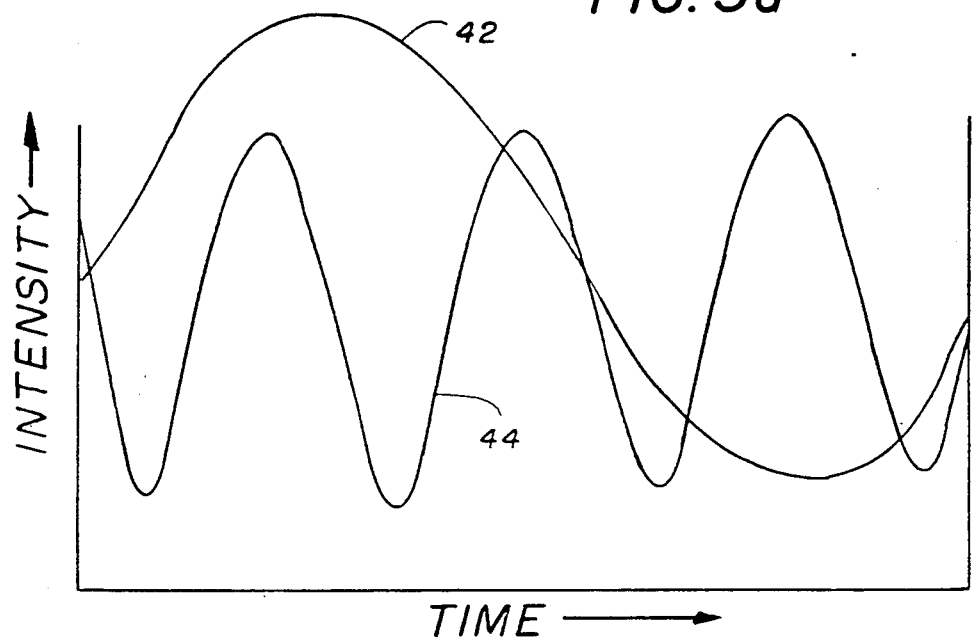

A bit of the theory of this invention will be discussed with reference to FIGS. 3a and 3b. In FIG. 3a, a characteristic photoresist etching curve is shown at 42, and a characteristic silicon dioxide etching curve is shown at 44. These curves represent the intensity of the reflected beam 28 as the etching process progresses, and are substantially sinusoidal. The curve 42 is typical of the intensity of the reflected beam if the incident beam is parked on photoresist 36, and the curve 44 is typical of the intensity of the reflected beam if the incident beam is parked on silicon dioxide 34.

The basic theories of thin film laser beam interferometry are well known to those skilled in the art. For example, a description of the theories can be found in the aforementioned Maydan et al. patent, which is incorporated herein by reference. Briefly, when a beam of light impinges on a semi-transparent film such as silicon dioxide, a portion of the incident light will be reflected from the top surface of the film and a portion of the incident light will be reflected from the bottom surface of the film. Since the film has a finite thickness, the two reflections will either constructively or destructively interfere with each other. As the layer is etched, its thickness is changed, thereby cycling the intensity of the reflected beam through constructive and destructive interference patterns to create the sinusoidal patterns shown.

It should be noted that the photoresist etching curve 42 is of greater magnitude and lower frequency than the silicon dioxide etching curve 44. The higher amplitude is due to the higher reflectivity of photoresist, and the lower frequency is due to the fact that photoresist etches much more slowly than silicon dioxide. Because the characteristic etching curves of photoresist and silicon dioxide are so different, it is not difficult for a system to distinguish between them as a laser beam is scanned across the surface of the wafer.

Figure 3B:
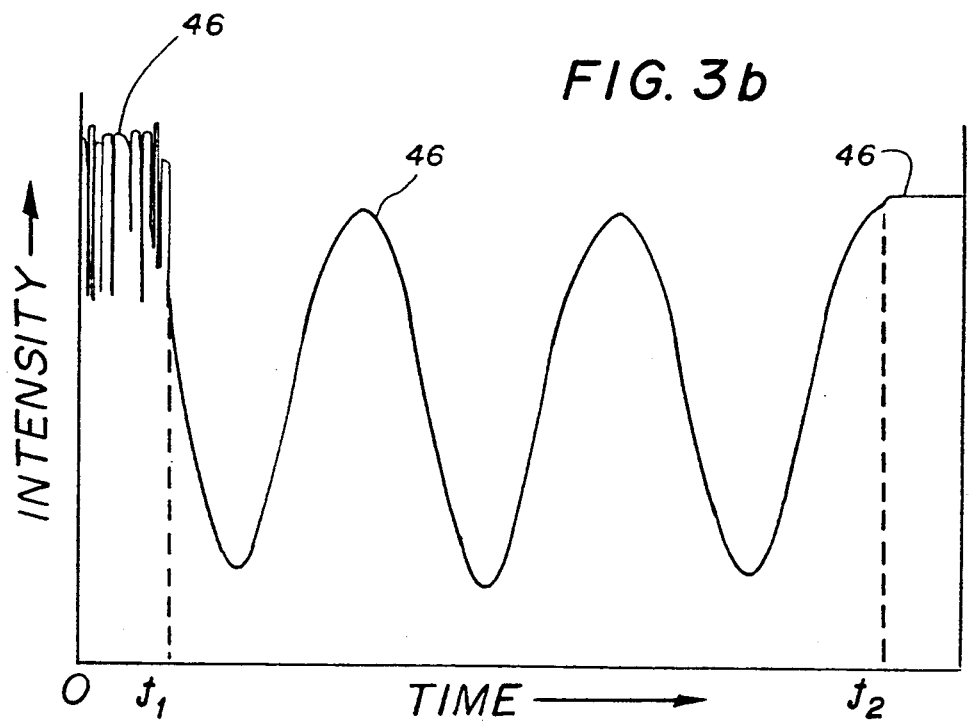
FIG. 3b is a graph of reflected interference pattern waveforms as a laser beam is scanned along a wafer as shown in FIG. 1 and then parked on a spot as shown in FIG. 2b.

In FIG. 3b, the intensity of the reflected beam 28 is plotted against time as the beam is first scanned across the wafer surface 14 as shown in FIGS. 1 and 2a, and then parked at a preferred spot P as shown in FIG. 2b. More specifically, the process is in the scanning mode from a time $0 <= t <= t_1$, and it is in the parking mode from time $t_1 < t <= t_2$. At time $t_2$ endpoint is detected by the flattening of the actual etching curve 46, indicating that all of the silicon dioxide at preferred spot P has been removed.

The actual etching curve 46 of FIG. 3b has a spiked appearance during the scanning mode because the reflected beam varies greatly in intensity as the incident beam is scanned across different surfaces and layers of the wafer 10. During the parking mode, the laser beam is parked on the layer being monitored, in this case silicon dioxide, and, as such, the curve takes on the characteristic etching curve of the silicon dioxide layer. As mentioned previously, the actual etching curve 46 flattens out after the silicon dioxide layer is etched away, indicating endpoint detection.

The preferred processes for picking a preferred parking spot and detecting endpoint from the actual etching curve will be discussed below. However, it should be understood that these methods are not limitations on the present invention but, rather, teach the best mode currently known for practicing the invention.

Preferred Parking Spot Detection Method

To ensure optimal accuracy of the interferometer process, the laser beam should be parked on a widest, flattest surface of the SiO$_2$ that can be detected along the scan path 20. Since the scribe lines 12 tend to be orders of magnitude greater in width than integrated circuit features, the optimal surface will most often be found within the boundaries of a scribe line 20.

For the purposes of discussion, it will be assumed that the beam spot 18 is stepped N times per scan along the scan path 20, and the intensity values of the reflected beam 28 are stored as data values in a digital database. These data values are stored as vectors associated with each scan, i.e. the first scan produces a vector S1 of N data values, the second scan produces a vector S2 of N data values, etc. As will be discussed in detail below, these vectors can be mathematically manipulated to determine the preferred parking location for the laser beam spot 18.

Figure 4:
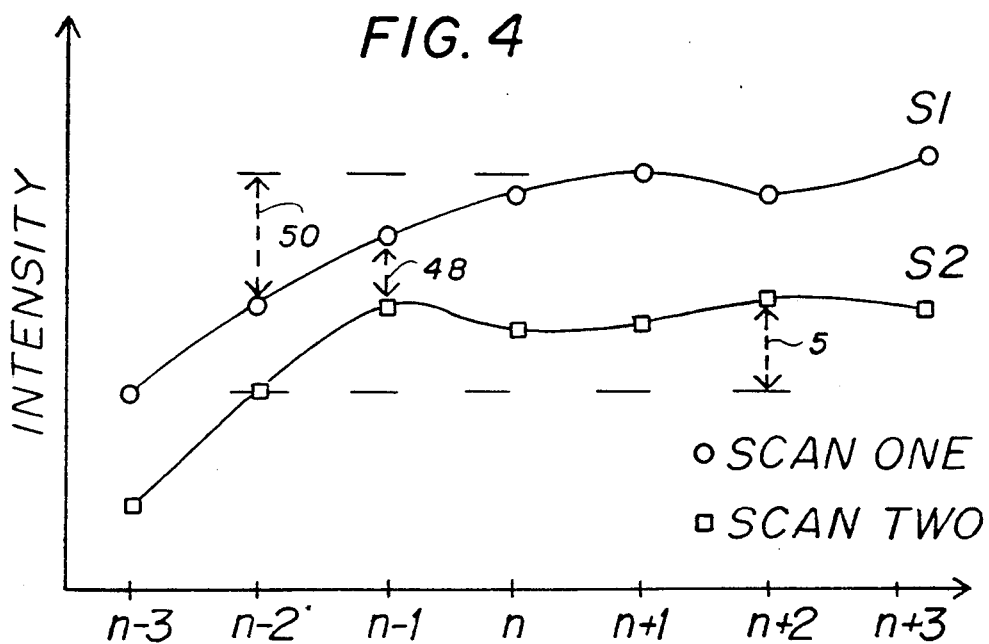
FIG. 4 is a graph of seven data-points taken in two successive scans of a semiconductor wafer.

With reference to FIG. 4, an arbitrary data value n is chosen as the center of a set of $2a+1$ data points ranging from $n-a$ to $n+a$, where in this example $a=3$. The seven data values of vector S1 which are centered at n are then compared against the corresponding seven data values of vector S2 which are centered at n to determine the minimum absolute difference 48 between the two. This minimum difference 48 will be designated S1S2$_{min}$, and is always a positive value. Next, $2b+1$ data values of vector S1, which are again centered at n, are compared to find the maximum absolute difference 50 between any two within the scan. In this example b is chosen to be 2. This maximum difference will be designated $S1_{max}$, and is also always a positive value. Similarly, the five data values of vector S2 which are centered at n are compared find the maximum absolute difference 52 to arrive at a positive value $S2_{max}$. A relative value R is then calculated as follows:

$$R = S1S2_{min} - [S1_{max} + S2_{max}]$$

where if $R<0$ then $R=0$ The value of n is then incremented by one, and the next relative value R is calculated as described above. The sequentially derived values for R are stored in a vector $R_{1:2}$.

For N data points, the first value for n will typically be $a+1$, while the last value for n will be $N-(a+1)$. It therefore follows that for vectors of N data values, there will be $N-(a+2)$ values in the vector $R_{1:2}$. These values are then compared to determine a Quality Factor $Q_{1:2}$, which is defined as the maximum data value within vector $R_{1:2}$.

The process described above is then repeated by comparing the Scan Two vector S2 against the Scan Three vector S3 to determine a Quality Factor $Q_{2:3}$, Scan Three vector S3 against Scan Four vector S4 to determine a Quality factor $Q_{3:4}$, etc. As a final step, all of the quality factors are compared to find the maximum quality factor $Q_{max}$. It is at the data point corresponding to $Q_{max}$ that the beam is parked. This process is summarized below in Table 1.

TABLE 1

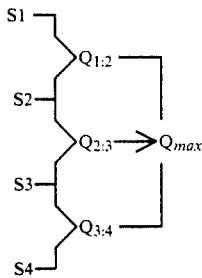

Figure 5A:
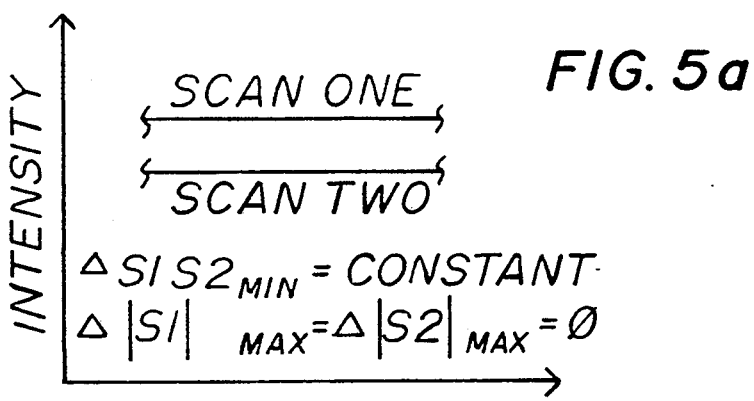
FIGS. 5a and 5b are graphs used to illustrate a preferred method for finding an optimal spot to park a laser beam.
Figure 5B:
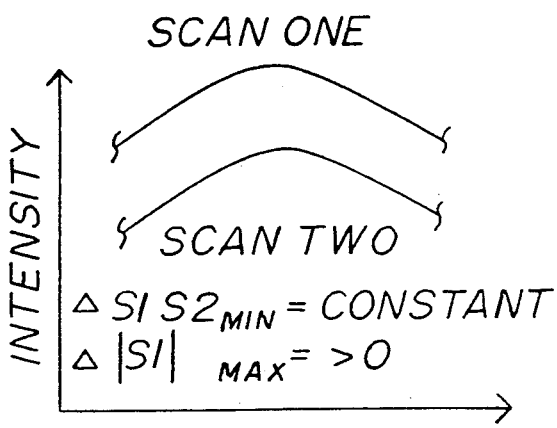

The theory behind this process will be discussed with reference to FIGS. 5a and 5b. First, we will ignore the effect of different distances between data points between pairs of scans. In FIG. 5a, both the Scan One and the Scan Two data values form straight, horizontal lines. In consequence, for any seven contiguous points centered at a data value n, the value of $S1S2_{min}$ is a constant. Also, $S1_{max}$ and $S2_{max}$ are equal to zero, since the data values are horizontally aligned. In FIG. 5b the seven contiguous points centered at data value n are also all equidistant between Scan One and Scan Two such that the value $S1S2_{min}$ is also a constant. However, in FIG. 5b the values $S1_{max}$ and $S2_{max}$ are both greater than zero. Therefore the value of R for the FIG. 5a plot will be greater than the value of R for the FIG. 5b plot by the amount $[S1_{max}+S2_{max}]$ of the FIG. 5b plot. The $S1_{max}$ and $S2_{max}$ values represent a lack of flatness in the area centered at data point n. Since FIG. 5a has a larger R value than FIG. 5b, the laser beam would rather park on the spot represented by FIG. 5a than the spot represented by FIG. 5b, i.e. on the flatter spot.

The effect of $S1S2_{min}$ is to center the preferred spot within the preferred flat area. This is because $S1S2_{min}$ decreases as the data point approaches a transition. In consequence, $S1S2_{min}$ tends to be maximum at the center of any particular flat area. It is therefore clear that the formula: $R = S1S2_{min} - [S1_{max} + S2_{max}]$ is assigning a value to R which reflects the relative desirability of the spot, both with respect to it being in the largest, flattest area available and with respect to it being centered within that area.

It should be noted that there must be a phase difference between adjacent scans to ensure that the two scans do not coincide. This can be accomplished by making the scanning frequency higher (e.g. 3-4 times higher) than the frequency of the characteristic etching curve of the silicon dioxide.

Endpoint Detection Method

As mentioned previously with reference to FIG. 3b, once the laser beam has been parked on a spot of oxide that is being etched, the reflected interference pattern will typically take a sinusoidal shape. When the oxide has been etched through, the sinusoid will flatten, indicating end point detection. At that point in time, the etching process is usually terminated.

It is not necessarily disastrous or even undesirable to over-etch, i.e. continue to etch after the oxide has been completely etched through. In fact, many processes deliberately over-etch to ensure complete removal of film being etched in areas of the wafer that are not being monitored. What is crucial is the repeatability of the etch process: the same amount of etching must predictably occur cycle after cycle. Accurate endpoint detection is therefore important so that the desired amount of over-etching (if any) can be accomplished.

Figure 6B:
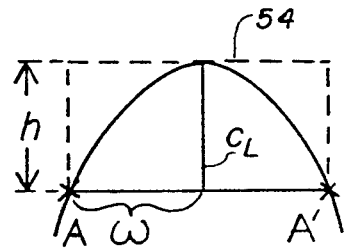
FIGS. 6a, 6b, and 6c are portions of an waveform used to illustrate a preferred method for endpoint detection.
Figure 6A:
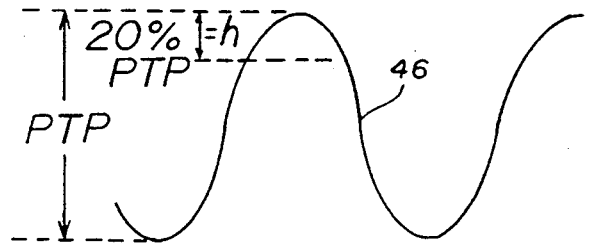

With reference to FIGS. 6a and 6b, the actual etching curve 46 is continuously monitored by the system to determine its Peak-To-Peak (PTP) value. This PTP value can be updated every ½ cycle of the actual etching curve. A calculation is then made to calculate h, which is, in this example, 20% of the PTP value. As seen in FIG. 6b, the value h defines a box 54 having corners at points A, A' on the actual etching curve which encloses the top 20% of the curve. The centerline of the box is designated by line $C_L$, and the width of the box is designated as 2W.

Figure 6C:
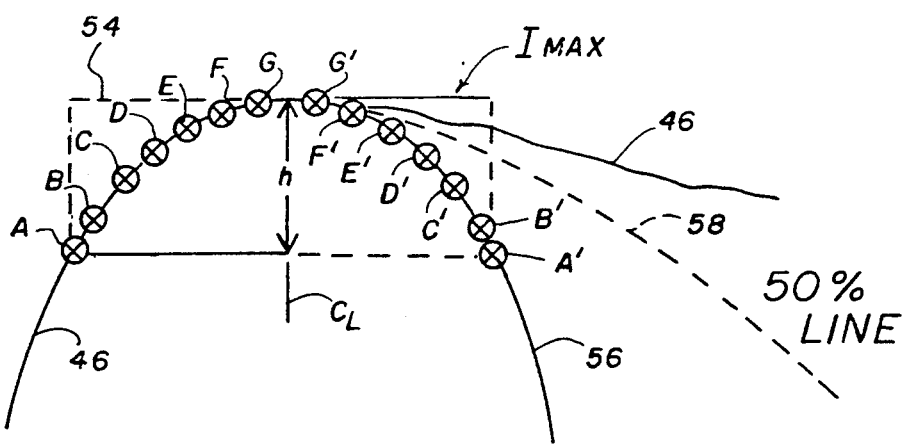

With reference to FIG. 6c, when the system detects that the actual etching curve 46 interference pattern has reached point A, i.e. the curve has entered the area of the box 54, the intensity value of A is stored within memory. As the oxide continues to etch, a series of intensity values (represented here by points B, C, . . . , G) up to the maximum value $I_{max}$ on the intensity pattern are also stored within memory. These values are then reflected around the centerline $C_L$ to create pseudo-values A', B', . . . , G' which define a projected curve segment 56. A threshold line 58 is defined as being halfway between the $I_{max}$ value and the projected curve 56. In other words, the threshold line will have points at $(I_{max}-G')/2$; $(I_{max}-F')/2$; $(I_{max}-E')/2$; etc. The actual etching curve 46 after the centerline $C_L$ are then detected, stored, and compared against the threshold line 58. If all of the data values of the actual etching curve 46 centerline $C_L$ are above the threshold line 58 then endpoint has been detected. Otherwise, the surface is still etching, and the above process is repeated until endpoint is detected. It will be noted that this method will find the endpoint within h % of the PTP value of the characteristic etching curve, which can be arbitrarily small depending upon the desired endpoint detection sensitivity.

Endpoint Detection System Apparatus

Figure 7A:
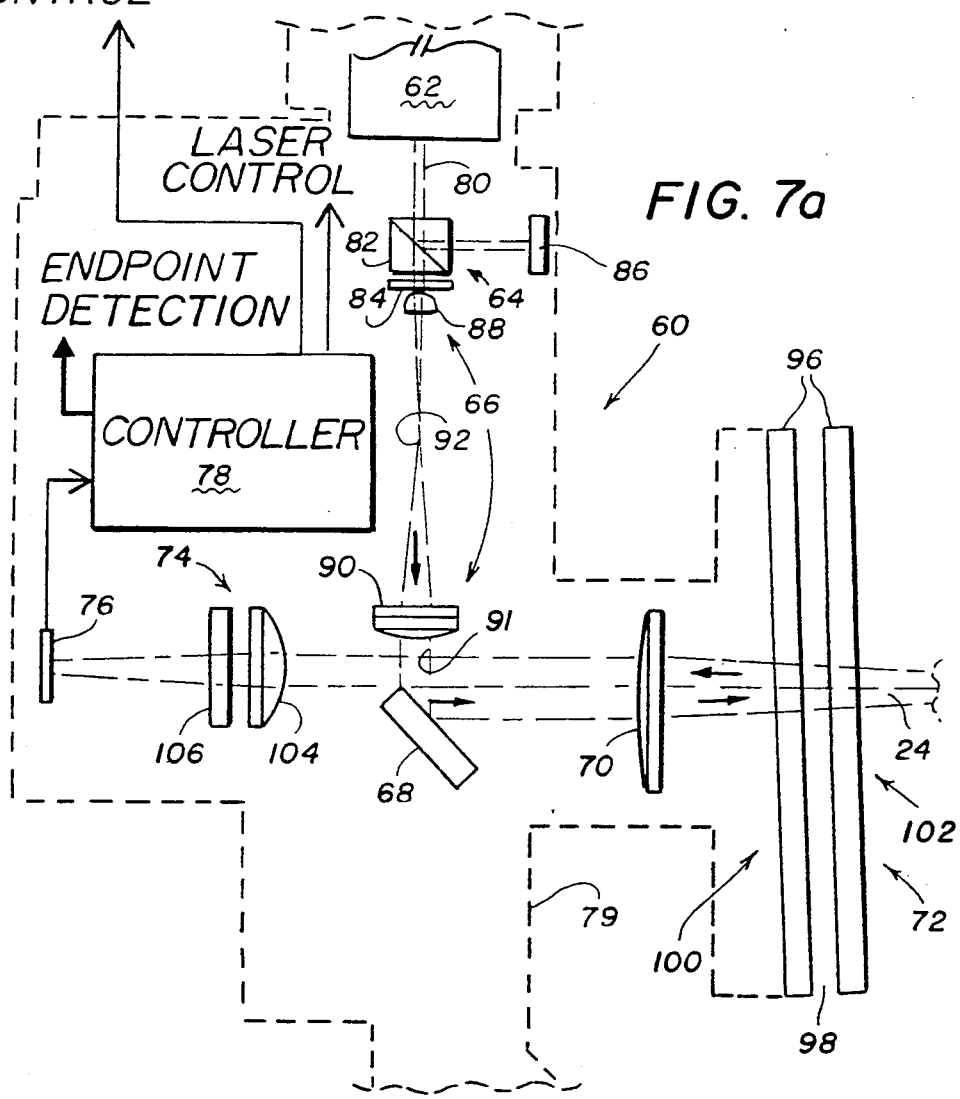
FIGS. 7a and 7b illustrate the optical path of a laser beam through an endpoint detection apparatus in accordance with the present invention.
Figure 7B:
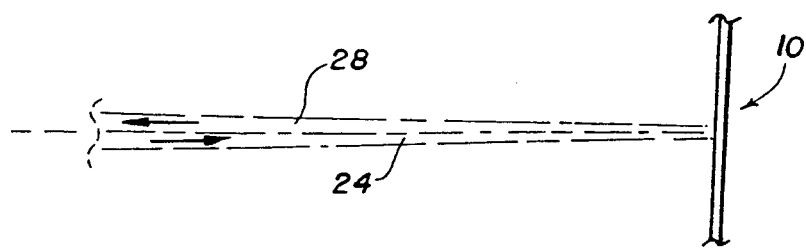

The apparatus of the present invention will be discussed with reference to FIGS. 7a, 7b, and 8. In FIG. 7a, an endpoint detection system 60 includes a laser 62, an optical isolation assembly 64, and expander assembly 66, a mirror 68, a focussing assembly 70, a window assembly 72, a collector assembly 74, a detector 76, and a controller 78. The system 60 is enclosed within an enclosure 79 to protect the delicate optics and to minimize noise from such factors as air currents, etc.

The laser 62 is preferably a commercially available, polarized helium-neon (HeNe) gas laser. The beam 80 of the laser 62 is directed towards the optical isolation assembly 64, which minimizes the amount of light reflected back to the laser 62. Such reflected back light is problematic in that it can cause intensity drift of the laser beam 80. More specifically, the optical isolation assembly includes a polarizing beam splitter 82, and a ¼ wave plate 84. The axis of polarization of the beam splitter 82 is aligned with the axis of polarization of the polarized laser 61, and the ¼ wave plate 84 circularly polarizes the beam 80. The combination of these elements reduces back-reflection of light to the laser 62 considerably because: 1) the back reflected light would have to be circularly polarized in phase with the ¼ wave plate polarization and 2) only that portion of the in-phase backreflected circularly polarized light which aligns with the axis of polarization of the beam splitter 82 will make it back to laser 62. This is generally an insignificant amount. An optional detector 86 can be used to monitor the output of laser 62.

Expander assembly 66 includes a pair of lenses 88 and 90 having the same focal point 92. This arrangement of lenses results in a collimated beam 91. This beam is reflected from mirror 68 at substantially right angles and through focussing assembly 90 and window assembly 72 to the wafer 10 (see FIG. 7b), thereby forming incident beam 24. A reflected beam 28 is reflected from the surface of wafer 10 and back through the window assembly 72, focussing assembly 70, past the edge of the mirror 68, into the collector assembly 74, and onto the detector 76. The mirror 68 is preferably a front-silvered mirror of minimal reflective loss.

The window assembly comprises a pair of spaced-apart quartz window panes 96. The space 98 between the window panes 96 provides thermal isolation between the optics side 100 and the wafer side 102 of the window assembly. This is an important feature, because the wafer side 102 faces the etcher's reaction chamber and, thus, is exposed to high temperatures.

The collector assembly 74 includes a collecting lens 104 and a filter 106. The lens helps to focus the reflected beam 28 on the detector 76, while the filter removes undesired frequencies of light generated by plasma discharge, ambient lighting, etc. The detector 76 can be any of a variety of photodetectors sensitive to light in the frequency range of laser 62.

The output of the detector 76 is input into controller 78, which is basically a dedicated microcomputer system. The controller 78 provides outputs to control the stage movements, the operation of the laser, etc. and has an output indicating endpoint detection. The endpoint detection signal generated by controller 78 can be used to automatically shut down the etching process, or to alert an operator to the endpoint condition.

Figure 8:
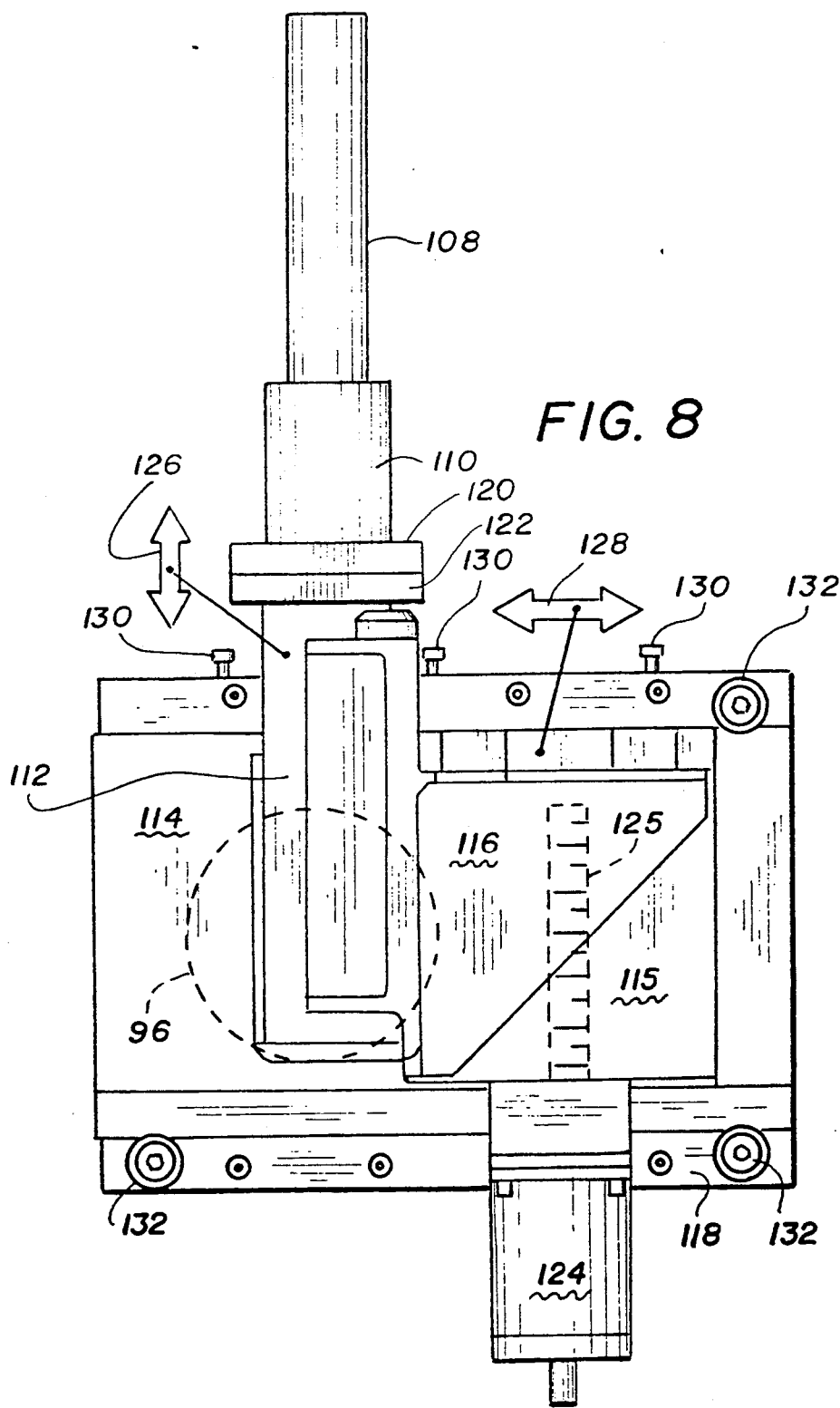

Referring now to FIG. 8, a top plan view of the endpoint detection system 60 shows a laser head 108, an adaptor 110, an optics housing 112, a slidable plate 114, a stage 115, a detector housing 116, and a base 118. The detector housing 116 is rigidly attached to the optics housing 112 and to the stage 115. A flange 120 of adaptor 110 couples the adaptor to a flange 122 of optics housing 112. A quartz window 96 can be seen in phantom beneath the optics housing 112 and plate 114.

A stepper motor 124 mounted on plate 114 has a lead screw 125 which can drive the stage 115 and thus the optical housing 112 and detector housing 116 back and forth as indicated by bi-directional arrow 126. This movement of the optical housing 112 causes the scanning of the laser beam spot 18 along the path 20. The plate 114 and everything carried by the plate 114 can be moved back and forth as indicated by bi-directional arrow 128 after the loosening of thumb screws 130 which clamp along an edge of plate 114. This manual adjustment corresponds to the adjustment of the beam path along axis 22 of FIG. 1.

The beam spot can be focussed and aligned by adjusting three screws 132 provided at three corners of the base 118. These screws press against plate 114 to create a conventional three-point adjustment arrangement. With these three screws 132, the pitch, roll, and focus of the beam can be adjusted, as will be apparent to those skilled in the art. The fourth corner of plate 114 provides a pivot point for the plate.

Beam Focussing Method

Figure 9:
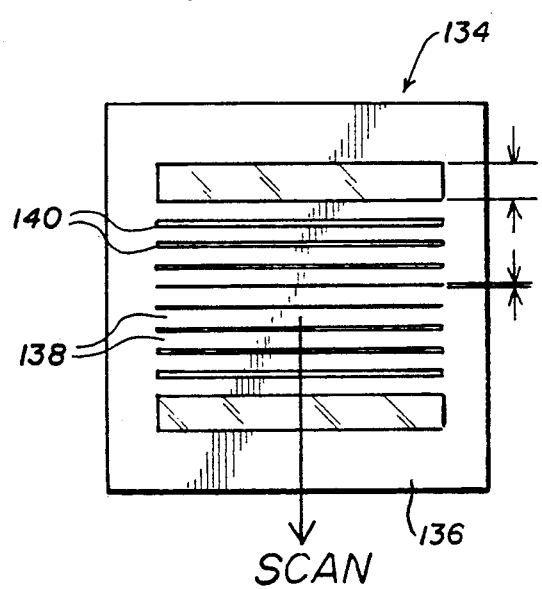
FIG. 9 is a top plan view of a test pattern formed on a semiconductor wafer which is used to help focus a laser beam.

A preferred method for focussing the beam spot will be discussed with reference to FIGS. 9–11. In FIG. 9, a pattern 134 is produced on a surface 136. Alternatively, grooves corresponding to the pattern 134 could be cut into a surface 136. In either case, a pattern of alternating relatively reflective regions 138 and relatively non-reflecting regions 140 are provided on a planar surface. In this example, the non-reflecting regions 140 are of varying width, while the reflecting regions 138 are of substantially constant width. For example, the center region 140 could be 34 micrometers wide, the two regions 140 flanking the center region could be 36 micrometers wide, the next two flanking regions 140 could be 38 micrometers wide, etc.

Figure 10A:
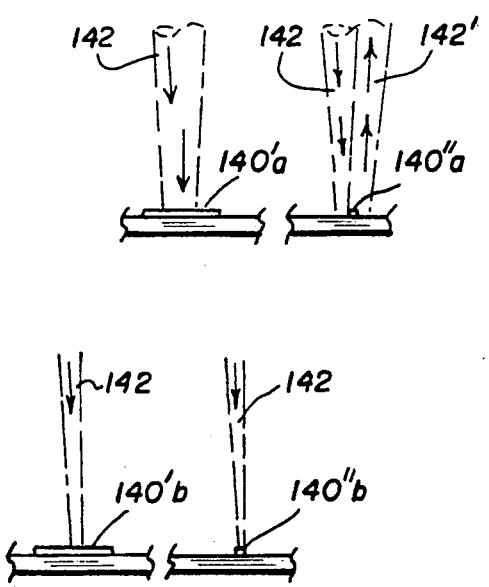
FIGS. 10a and 10b illustrate an unfocussed and a focussed laser beam, respectively, impinging upon different portions of the test pattern of FIG. 9.
Figures 11A, 11B:
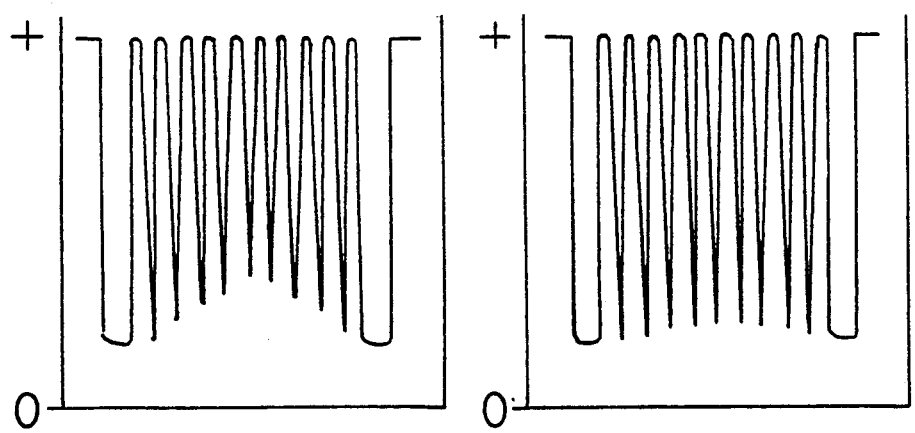
FIGS. 11a and 11b are graphs of the relative intensities of the reflected laser beams from an unfocussed and a focussed laser beam, respectively.

With reference to FIG. 10a, an unfocussed beam 142 impinging on a wide non-reflecting region 140'a is substantially completely absorbed. However, when the unfocussed beam 142 impinges on a narrow non-reflecting region 140"a, a portion of the incident beam will be reflected at 142'. When the intensity of the reflected beams for unfocussed incident beams being scanned across the test pattern 134 are monitored, a waveform such as that shown at 11a is developed.

Figure 10B:
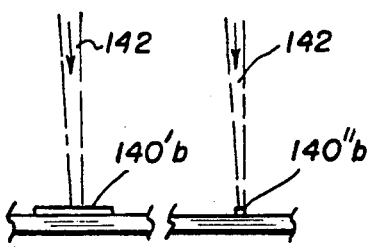

In FIG. 10b, a focussed beam 142 will be absorbed whether it falls on a wide region 140'b or a narrow region 140"b. Therefore, there will be little or no reflected beam for a focussed incident beam. A focussed beam will therefore produce a wave pattern such as that shown at FIG. 11b.

The method for focussing the beam spot involves scanning the wafer in a direction perpendicular to the pattern 134, and monitoring the intensity of the reflected beam. The beam adjustment screws 132 (see FIG. 8) are then adjusted to minimize the variance (and therefor the average intensity) of the reflected beam. The beam spot will be focussed at the point of minimum detected variance.

Of course, many other test patterns can be used other than the one shown. Furthermore, the pattern could have reflective regions of varying width, where the object is to minimize the variance by maximizing the average intensity.

While this invention has been described with reference to several preferred embodiments, various alterations and permutations of the invention will no doubt become apparent to those skilled in the art upon a reading of the preceding descriptions and a study of the various figures of the drawing. For example, while this invention has discussed primarily the etching of oxide beneath a photoresist mask, a variety of other etched and masking materials can be used. For example, other suitable materials to be monitored for endpoint detection include polysilicon, silicon nitride, and BPSG. It is therefore intended that the scope of the present invention be determined by the following appended claims.

What is claimed is:

1. A method for detecting an etch process endpoint when a layer of material has been etched away from the surface of a substrate, comprising the steps of:

parking a beam of radiant energy on a spot on said layer;

producing an actual etching signal waveform by detecting the amplitude of a signal produced by interference between said beam of radiant energy and a portion of said beam reflected off of said layer;

comparing successive values of said actual etching signal waveform over a period of time with a sinusoidal projected etching curve and detecting the endpoint of the etch process when the waveform of the actual etching signal flattens so as to diverge from the projected etching curve.

* * * * *